(12) United States Patent
Shimizu et al.

(10) Patent No.: US 6,556,485 B2
(45) Date of Patent: Apr. 29, 2003

(54) OUTPUT BUFFER CAPABLE OF ADJUSTING CURRENT DRIVABILITY AND SEMICONDUCTOR INTEGRATED CIRCUIT DEVICE HAVING THE SAME

(75) Inventors: Tadayuki Shimizu, Hyogo (JP); Hirotoshi Sato, Hyogo (JP); Masaki Tsukude, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/972,242

(22) Filed: Oct. 9, 2001

(65) Prior Publication Data

US 2002/0141246 A1 Oct. 3, 2002

(30) Foreign Application Priority Data

Apr. 2, 2001 (JP) .......................................... 2001-102987

(51) Int. Cl.[7] ................................................. G11C 7/00
(52) U.S. Cl. ............................ 365/189.05; 365/189.04; 365/189.08
(58) Field of Search ............................. 365/189.05, 191, 365/230.06, 189.04, 189.01, 154, 189.08

(56) References Cited

U.S. PATENT DOCUMENTS 5,896,400 A * 4/1999 Roohparvar et al. ........ 714/724
6,037,813 A * 3/2000 Eto et al. .................... 327/156

FOREIGN PATENT DOCUMENTS

| JP | 7-38408 | 2/1995 |
| JP | 8-125519 | 5/1996 |

* cited by examiner

*Primary Examiner*—David Nelms
*Assistant Examiner*—Thong Le
(74) *Attorney, Agent, or Firm*—McDermott, Will & Emery

(57) ABSTRACT

An output buffer includes first current driving units connected in parallel between a power-supply voltage and an output node; second current driving units connected in parallel between a ground voltage and an output node; a plurality of operation selection circuits setting the respective first and second current driving units to be in either activated or inactivated state in a non-volatile manner; first signal transmission circuits arranged respectively corresponding to the first current driving circuits and each transmitting the level of output data with a similar first propagation time period; and second signal transmission circuits arranged respectively corresponding to the second current driving units and each transmitting the level of the output data with a similar second propagation time period.

17 Claims, 12 Drawing Sheets

OUTPUT BUFFER CAPABLE OF ADJUSTING CURRENT DRIVABILITY AND SEMICONDUCTOR INTEGRATED CIRCUIT DEVICE HAVING THE SAME

BACKGROUND OF THE INVENTION

1. Field of the Invention

The present invention relates to a semiconductor integrated circuit device, and more particularly, to a semiconductor integrated circuit device having an output buffer for executing data output.

2. Description of the Background Art

Semiconductor integrated circuit devices applied to various electronics execute operations in accordance with instructions and output the resulting data signals. In such a case, the data signal output from a semiconductor integrated circuit devices are driven by an output buffer, with consideration given to an output load from a subsequent circuit receiving the data signal.

FIG. 16 is a schematic block diagram showing a configuration of a conventional semiconductor integrated circuit device 1 including output buffers.

Referring to FIG. 16, semiconductor integrated circuit device 1 includes an internal circuit 2 and output buffers 3, 4. The semiconductor integrated circuit device outputs data signals D1 and D2 from output nodes 5 and 6, respectively, based on output data Dr from internal circuit 2 output in response to an operation instruction.

Data signals D1 and D2 are supplied to different destinations, so that output loads LD1 and LD2 at the respective output nodes 5 and 6 are also different from each other. Output loads LD1 and LD2 correspond to the line capacitance between the respective nodes and the subsequent circuits to be supplied with data signals D1 and D2, the input capacitance in the respective subsequent circuits, and so forth.

Internal circuit 2 generates data level control signals Dh and Dl indicating the level of output data Dr output in response to the operation instruction. Data level control signal Dh is activated to be at a logic low level (hereinafter simply referred to as L level) when output data Dr is at a logic high level (hereinafter simply referred to as H level). On the other hand, data level control signal Dl is activated to be at the H level when output data Dr is at the L level.

Output buffers 3 and 4 drive data signals D1 and D2 onto output nodes 5 and 6, respectively, in accordance with data level control signals Dh and Dl output from internal circuit 2.

Output buffer 3 includes a P-channel transistor 7a and an N-channel transistor 7b. P-channel transistor 7a is turned on in response to the activation (to the L level) of data level control signal Dh, to form a current path between output node 5 and a power-supply voltage Vcc. N-channel transistor 7b is turned on in response to the activation (to the H level) of data level control signal Dl, to form a current path between output node 5 and a ground voltage Vss.

Output buffer 4 has a configuration similar to that of output buffer 3, and includes an N-channel transistor 8a and a P-channel transistor 8b. P-channel transistor 8a is turned on in response to the activation (to the L level) of data level control signal Dh, to form a current path between output node 6 and power-supply voltage Vcc. N-channel transistor 8b is turned on in response to the activation (to the H level) of data level control signal Dl, to form a current path between output node 6 and ground voltage Vss.

In each of output buffers 3 and 4, the amount of current on the current path formed between a voltage according to the level of output data Dr and the associated output node 5 or 6, i.e. a current drivability of an output buffer, corresponds to the sizes of the transistors constituting each output buffer.

FIGS. 17A and 17B each schematically shows a relationship between the current drivability of an output buffer and a change in the voltage of a data signal.

In FIGS. 17A and 17B, an example of a voltage change of output node 5 is shown, in which output buffer 3 outputs data signal D1 of the H level.

FIG. 17A illustrates a waveform in the case where the current drivability of the output buffer is small with respect to the output load. Referring to FIG. 17A, at time ta, data level control signal Dh is activated to be at the L level in order to set data signal D1 to be at the H level. In response to the activation, P-channel transistor 7a within output buffer 3 forms a current path between power-supply voltage Vcc and output node 5 with a current drivability corresponding to the size of the transistor.

However, when the size of P-channel transistor 7a is small and thus the current drivability of the output buffer is small with respect to output load LD1, the voltage of output node 5 is increased in a gentle slope, requiring relatively long time period Δt1 before the voltage of output node 5 exceeds a predetermined voltage Vr corresponding to the H level data at time tb.

Thus, if the current drivability of the output buffer is excessively small, the voltage of output node 5 cannot change rapidly, reducing the speed of the data output, and hence the specification such as access time may not be satisfied.

Whereas, in FIG. 17B, a waveform in the case where the current drivability of the output buffer is excessively large with respect to the output load. Referring to FIG. 17B, at time ta, data level control signal Dh is activated to be at the L level. In response to the activation, P-channel transistor 7b within output buffer 3 forms a current path between ground voltage Vss and output node 5 with a current drivability corresponding to the size of the transistor.

However, when the size of P-channel transistor 7b is large and thus the current drivability of the output buffer is excessively large with respect to output load LD1, the voltage of output node 5 is rapidly increased. Therefore, time period Δt2 needed before the voltage of output node 5 exceeds predetermined voltage Vr at time tc is shortened, allowing a high-speed data output. However, such a rapid change in the voltage involving an overshoot or undershoot may generate noise, which would adversely affect the operation of a subsequent circuit.

Therefore, it is necessary to design the current drivability of each output buffer to be at an appropriate value in accordance with a corresponding output load, so as not to cause the action as shown in FIGS. 17A and 17B.

Referring again to FIG. 16, in the conventional semiconductor integrated circuit device 1, in order to change the current drivability of each of output buffers 3 and 4, the sizes of transistors 7a, 7b, 8a and 8b constituting the output buffers must be changed, which involves a design change or mask revision at manufacturing of the device. Thus, enormous cost and time are needed for adjustment of the current drivability of the output buffer.

In order to solve such problems and to make the current drivability of the output buffer easily adjustable, Japanese Patent Laying-Open No. 7-38408 (hereinafter also referred to as Document 1) discloses, in FIGS. 2 and 3, the configuration of an output buffer using a plurality of transistors connected in parallel.

The output buffer shown in FIG. 2 of Document 1 includes a plurality of transistors arranged in parallel with each other for supplying current to an output terminal, and a plurality of fuse units respectively connected between the gates of these transistors and an input terminal. Such an arrangement allows adjustment of the amount of driving current of the output buffer, by adjusting the number of activated transistors by cutting-off of the fuse units.

However, the arrangement of the output buffer shown in FIG. 2 of Document 1 has a problem of positioning of the fuse units. If the fuse units are arranged in a region adjacent to transistor elements constituting the output buffer, constraint in the layout design will be severe. Moreover, increase of the level of a blow input for ensuring cut-off of the fuse units may adversely affect the circuit portion of the output buffer.

If, on the other hand, the fuse units are concentrated in a specific region to ensure both secure cutting-off of the fuse units and elimination of the adverse effect on the other circuit portions, the time required for operation in the output buffer will be increased. This is because signals are propagated to the gates of the transistors constituting the output buffer through the fuse units.

The output buffer shown in FIG. 3 of Document 1 further includes a plurality of transistors arranged in parallel with each other for supplying current to an output terminal, and fuse units connected in series with the respective transistors. However, such an arrangement also causes a similar problem concerning the positioning of the fuse elements. In addition, the cut-off state of the fuse units may be a factor of variation in the amount of current supplied to the output terminal, possibly inhibiting stable operation.

Japanese Patent Laying-Open No. 8-125519 (hereinafter also referred to as Document 2) discloses, in FIG. 2, the configuration of a semiconductor device in which the current drivability of an output buffer is adjusted by a control circuit including a fuse.

In the semiconductor device shown in FIG. 2 of Document 2, a plurality of output current adjusting units are arranged in parallel with an output buffer circuit. Each output current adjusting unit is set to be in an activated state by cutting off the fuse included in a corresponding control circuit.

However, in the semiconductor device disclosed in Document 2, the output data from an IC circuit unit is transmitted to the gate of the transistor constituting the output buffer circuit via one stage of inverter, whereas it is transmitted to the gate of the transistor constituting each output current adjusting unit via an NAND gate. This results in different time periods for data propagation from the IC circuit unit to the gate of the transistor constituting the output current adjusting unit and to the gate of the transistor constituting the output buffer circuit.

Thus, in such a semiconductor device, the current path is formed between the output buffer circuit and the output terminal at a timing different from the timing at which the current path is formed between the current adjusting unit and the output terminal. This makes it difficult to adjust the data output timing at the output terminal, possibly causing unstabilized operation.

Furthermore, recently, a semiconductor integrated circuit device has been developed in which a plurality of chips are embedded in the same package to bring out a new function by combining the chips.

For example, there are a semiconductor integrated circuit device in which two chips of Dynamic Random Access Memories (DRAM) are contained within one package to double the capacity of the device; a semiconductor integrated circuit device in which two or four chips are mounted on one package to enlarge the bus width; and a semiconductor integrated circuit device in which a Static Random Access Memory (SRAM) and a flash memory are mounted in lamination on one package to enable the flash memory to be driven by an access to the SRAM. In particular, the one in which a plurality of chips are laminated is also referred to as a Multi-Chip Package (MCP).

In such an MCP semiconductor integrated circuit device, noise due to an output data signal has an increased effect on the circuit mounted on the other chips. Therefore, it is necessary to sufficiently adjust circuit operation conditions represented by a current drivability of an output buffer, and to efficiently set the adjusted operation conditions at the time of actual operation.

SUMMARY OF THE INVENTION

It is an object of the present invention to provide a configuration of a semiconductor integrated circuit device including an output buffer capable of easily adjusting a current drivability while securing operation stability.

Another object of the present invention is to efficiently set operation conditions of a circuit in a semiconductor integrated circuit device of a multi-chip package configuration including a plurality of chips.

According to an aspect of the present invention, a semiconductor integrated circuit device outputting data having first and second levels includes an internal circuit and an output buffer. The internal circuit outputs data to an internal node. The output buffer outputs the data read from the internal circuit onto the internal node to an output node. The output buffer includes a plurality of first current driving units, a plurality of second current driving units, a plurality of operation selection units, a plurality of first signal transmission units, and a plurality of second signal transmission units. The plurality of first current driving units are connected in parallel with each other between the voltage corresponding to the first level and the output node. Each of the first current driving units forms a current path between the voltage corresponding to the first level and the output node, in accordance with a voltage of a corresponding control node. The plurality of second current driving units are connected in parallel with each other between a voltage corresponding to the second level and the output node. Each of the second current driving units forms a current path between the voltage corresponding to the second level and the output node, in accordance with a voltage of a corresponding control node. The plurality of operation selection units are provided respectively corresponding to the plurality of first and second current driving units, and each of the plurality of operation selection units sets a corresponding one of the plurality of first and second current driving units in a non-volatile manner to be in one of activated and inactivated states at least after completion of an wafer manufacturing process. The plurality of first signal transmission units are provided respectively corresponding to the plurality of first current driving units, and each of the plurality of first signal transmission units transmits the level of the read data from the internal node to a control node of a corresponding first current driving unit with a first propagation time period, when a corresponding first current driving unit is in the activated state. The plurality of second signal transmission units are provided respectively corresponding to the plurality of second current driving units, and each of the plurality of second signal transmission units transmits the level of the read data from the internal node to a control node of a corresponding second current driving unit with a second propagation time period, when the corresponding second current driving unit is in the activated state.

Therefore, a main advantage of the present invention is that the first and second current driving units included in the output buffer can be selectively set to be in the activated or inactivated state in latter steps of the manufacturing process. Thus, the current drivability of the output buffer can easily be adjusted reflecting the noise effects on the other circuits, variation at manufacturing and so forth, without any change of design or mask revision. Moreover, the generalized design can be accommodated to a wide range of output loads, enabling alleviation of design load, reduction of inventory or the like. In addition, in each of the first and second current driving units that is set to be in the activated state, the signal propagation time period from the internal node to the control node is similarly set. Therefore, at least one of the first or second current driving units driving current onto the output node can be set to have a similar operation timing, to attain stabilized operation.

According to another aspect of the present invention, a semiconductor integrated circuit device having a plurality of chips enclosed within the same package includes an internal circuit, a memory circuit and a coupling unit. The internal circuit is formed on one of the plurality of chips. The memory circuit is formed on another one of the plurality of chips and is capable of, at least, reading of stored data. The coupling unit electrically couples the internal circuit and the memory circuit. The internal circuit operates in accordance with an operation condition set based on the stored data read from the memory circuit.

Therefore, the operation condition of the internal circuit mounted on one of the embedded plurality of chips can efficiently be set without execution of a non-volatile program inputting operation, e.g. without undergoing a fuse-blowing step.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
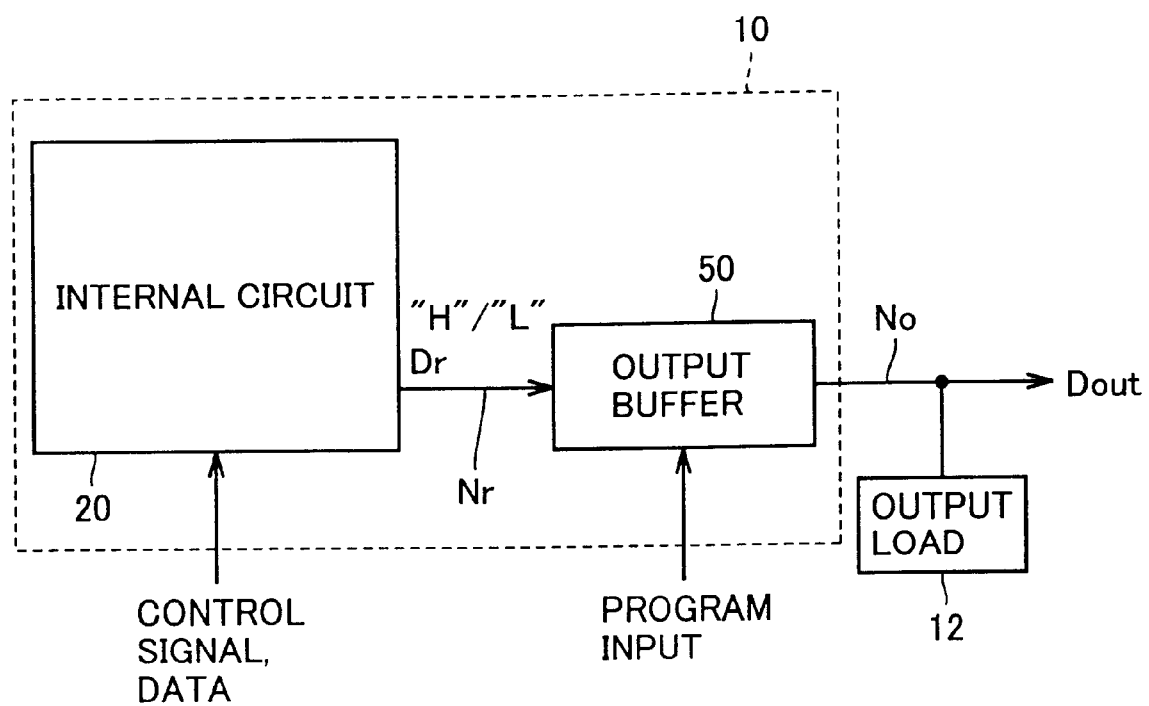
FIG. 1 is a schematic block diagram showing the entire configuration of a semiconductor integrated circuit device according to the first embodiment of the present invention.

Embodiments of the present invention will be described below in detail with reference to the drawings. It is noted that the same reference characters in the drawings indicate the same or corresponding portions.

First Embodiment

Referring to FIG. 1, a semiconductor integrated circuit device 10 according to the first embodiment of the present invention includes an internal circuit 20 and an output buffer 50. Internal circuit 20 outputs output data Dr to an internal node Nr based on data and a control signal indicating an operation instruction. Output data Dr is digital data, and is set to be either one of an H level and an L level.

Output buffer 50 generates a data signal Dout to an output node No in accordance with output data Dr from internal circuit 20. A current drivability of output buffer 50 can be set in a non-volatile manner in accordance with an external program input, at least after completion of the wafer manufacturing process. Output node No is provided with an output load 12. Thus, the current drivability of output buffer 50 must be appropriately set in accordance with output load 12.

Figure 2:
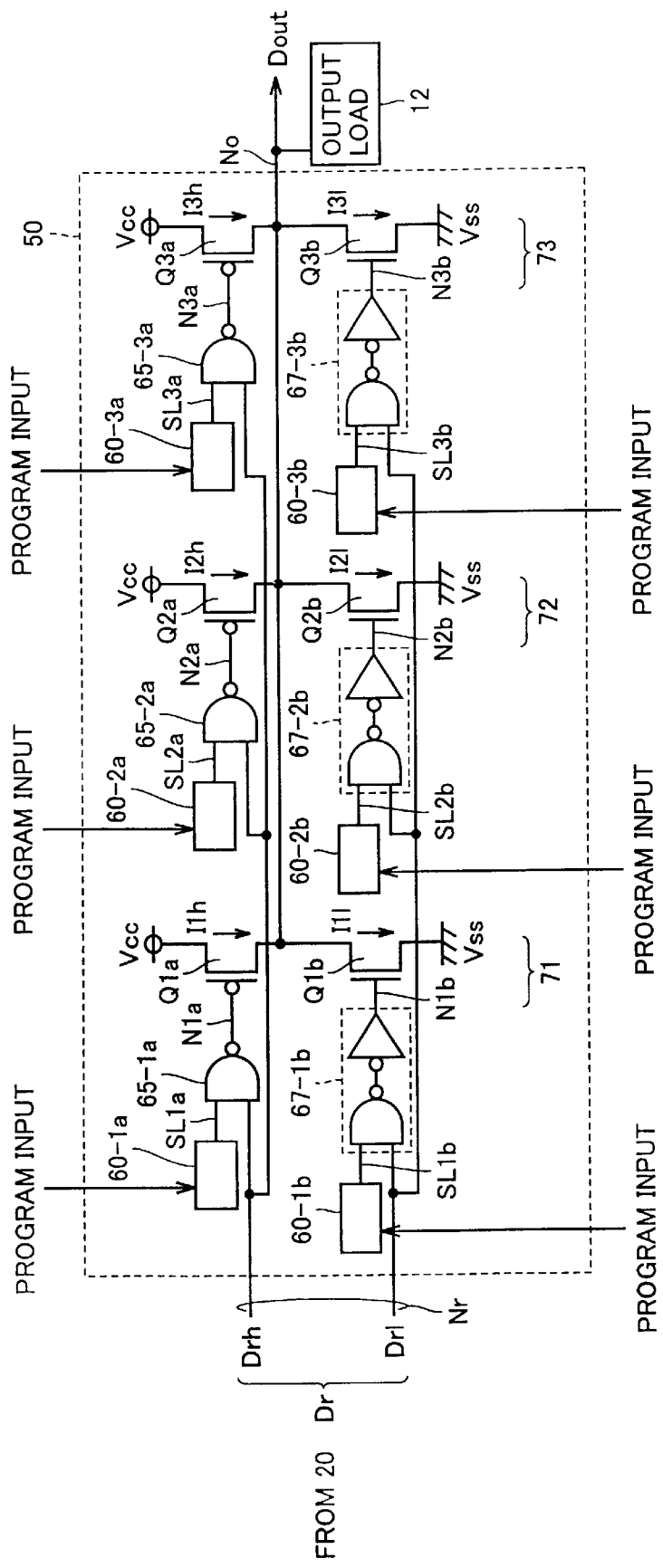
FIG. 2 is a circuit diagram showing the configuration of an output buffer shown in FIG. 1.

Referring to FIG. 2, internal circuit 20 outputs data level control signals Drh and Drl indicating the level of output data Dr onto internal node Nr. Data level control signals Drh and Drl are activated to be at the H level corresponding to the H level and L level of output data Dr, respectively.

Output buffer 50 includes current driving units Q1a, Q2a and Q3a connected in parallel with each other between a power-supply voltage Vcc corresponding to the H level of data signal Dout and output node No. Current driving units Q1a to Q3a each forms a current path between power-supply voltage Vcc and output node No in accordance with the voltages of nodes N1a to N3a, respectively. Each of current driving units Q1a to Q3a is constituted by, for example, a field effect transistor of a P-channel type. Therefore, current driving units Q1a to Q3a are hereinafter also simply referred to as P-channel transistors Q1a to Q3a, respectively.

Output buffer 50 further includes current driving units Q1b, Q2b and Q3b connected in parallel with each other between ground voltage Vss corresponding to the L level of data signal Dout and output node No. Current driving units Q1b to Q3b each forms a current path between ground voltage Vss and output node No in accordance with the voltages of nodes N1b to N3b, respectively. Each of current driving units Q1b to Q3b is constituted by, for example, a field effect transistor of an N-channel type. Therefore, hereinafter, current driving units Q1b to Q3b are also simply referred to as N-channel transistors Q1b to Q3b, respectively. Moreover, P-channel transistors Q1a to Q3a and N-channel transistors Q1b to Q3b are also simply referred to as transistors Q1a to Q3a, Q1b to Q3b.

Although the number of current driving units arranged in parallel, i.e. the number of P-channel transistors and N-channel transistors, is exemplified as three each in the configuration according to the embodiments of the present invention, application of the present invention is not limited to such a configuration, and the arrangement number of the current driving units may be determined arbitrarily.

Furthermore, it is not necessary to couple each of P-channel transistors to a common power-supply voltage Vcc, and a plurality of power-supply voltages having different levels may be coupled to the respective P-channel transistors. This can improve the degree of freedom for the adjustment of the current drivability of the output buffer. This can further be used for switching that is associated with the case where one chip is used for a plurality of products having different operation power-supply voltages.

Output buffer 50 further includes operation selection circuits 60-1a to 60-3a, 60-1b to 60-3b provided corresponding to transistors Q1a to Q3a, Q1b to Q3b, respectively.

Figure 3:
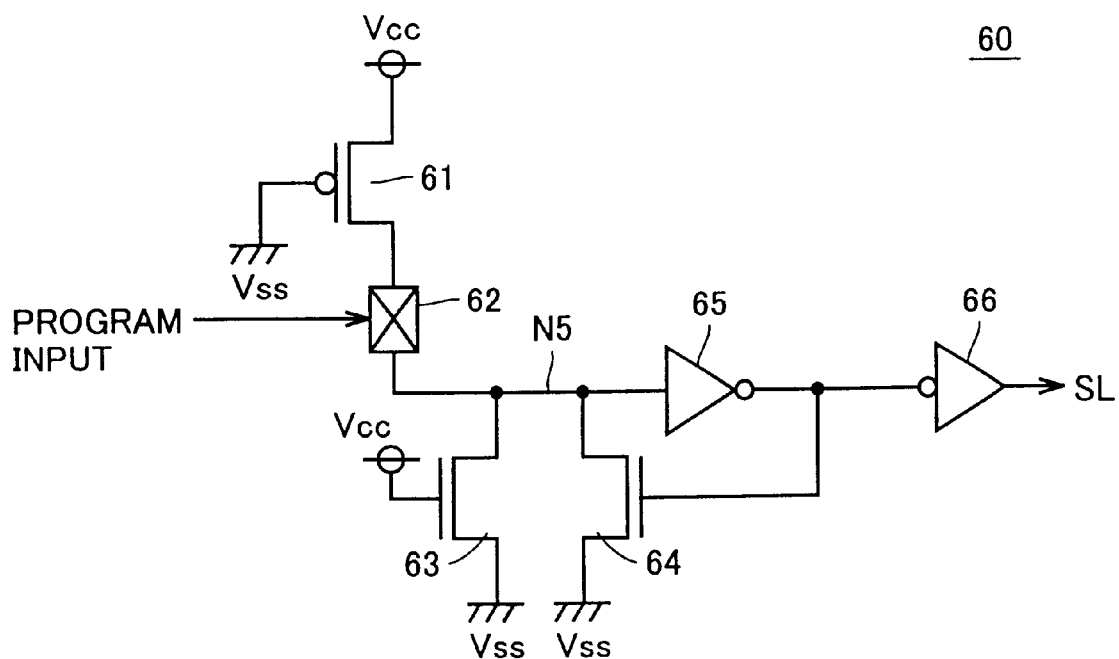
FIG. 3 is a circuit diagram showing the configuration of an operation selection circuit shown in FIG. 2.

Because each of the operation selection circuits shown in FIG. 2 has the same configuration, these operation selection circuits 60-1a to 60-3a and 60-1b to 60-3b are collectively referred to as an operation selection circuit 60 in FIG. 3 in describing the configuration thereof.

Referring to FIG. 3, operation selection circuit 60 includes a P-channel transistor 61 and a program unit 62 connected in series between power-supply voltage Vcc and node N5, N-channel transistors 63 and 64 connected in parallel between node N5 and ground voltage Vss, an inverter 65 inverting the voltage level of node N5 and outputting the inverted result, and an inverter 66 further inverting the output of inverter 65 and generating a selection signal SL.

The gate of P-channel transistor 61 is coupled to ground voltage Vss. The gate of N-channel transistor 63 is coupled to power-supply voltage Vcc. The gate of N-channel transistor 64 is coupled to the output node of inverter 65. Therefore, when the output of inverter 65 is at the H level, N-channel transistor 64 and inverter 65 will latch the L level voltage (ground voltage Vss) at node N5, i.e. the L level of selection signal SL.

Program unit 62 is set to be in either a conductive state or a nonconductive state in a non-volatile manner in accordance with presence/absence of a program input. For example, when program unit 62 is constituted by a fuse element, if no program input, i.e. no laser blow input, is applied, program unit 62 is in the conductive state, whereas once the program is applied, program unit 62 is set to be in the non-conductive state in a non-volatile manner.

The current drivability of P-channel transistor 61 is designed to be larger than the current drivability of N-channel transistor 63. Hence, when program unit 62 is in the conductive state, the voltage of node N5, i.e. the level of selection signal SL, is set to be at the H level (power-supply voltage Vcc). On the other hand, when program unit 62 is set to be in the non-conductive state, selection signal SL is set to be at the L level.

Thus, operation selection circuit 60 generates selection signal SL having a level corresponding to either one of the conductive and nonconductive states of program unit 62. In other words, the signal level of selection signal SL output by operation selection circuit 60 may be set in a non-volatile manner in accordance with an external program input.

It is noted that, for program unit 62, a so-called anti-fuse element may also be used, which has a relation between the program input and the conductive/non-conductive states opposite to that of the fuse element.

Referring again to FIG. 2, operation selection circuits 60-1a to 60-3a output selection signals SL1a to SL3a for setting respective P-channel transistors Q1a to Q3a to be in either one of the activated and inactivated states. Likewise, operation selection circuits 60-1b to 60-3b output selection signals SL1b to SL3b for setting the respective N-channel transistors Q1b to Q3b to be in either one of the activated and inactivated states. In the configuration of FIG. 2, the transistor with a corresponding selection signal activated to be at the H level is set to be in the activated state, whereas the transistor with a corresponding selection signal inactivated to be at the L level is set to be in the inactivated state.

Output buffer 50 further includes signal transmission circuits 65-1a to 65-3a provided respectively corresponding to P-channel transistors Q1a to Q3a. Each of signal transmission circuits 65-1a to 65-3a is constituted by an NAND gate.

Signal transmission circuit 65-1a transmits an NAND operation result of selection signal SL1a and data level control signal Drh to node N1a, i.e., to the gate of P-channel transistor Q1a. Signal transmission circuit 65-2a transmits the NAND operation result of selection signal SL2a and data level control signal Drh to node N2a, i.e. the gate of P-channel transistor Q2a. Signal transmission circuit 65-3a transmits the NAND operation result of selection signal SL3a and data level control signal Drh to node N3a, i.e., to the gate of transistor Q3a.

Such a configuration allows each of P-channel transistors Q1a to Q3a to form a current path corresponding to the size of the transistor, between power-supply voltage Vcc and output node No, in response to the activation of data level control signal Drh to the H level, when a corresponding selection signal is set to be at the H level, i.e., to be in the activated state. In FIG. 2, the current drivability of P-channel transistors Q1a to Q3a are denoted by I1h to I3h, respectively.

Current drivability I1h to I3h may be set to be the same or different. In particular, by setting the current drivability exponentially, such that I2h=2·I1h, and I3h=2·I2h, the current drivability of the output buffer can be set stepwise in quantization.

Accordingly, the current drivability for driving data signal Dout to be at the H level (power-supply voltage Vcc) can be adjusted stepwise, in accordance with presence/absence of the program input to operation selection circuits 60-1a to 60-3a.

For example, the program input is provided to operation selection circuits 60-1a and 60-2a, transistors Q1a and Q2a are set to be in the activated state. Thus, the current drivability at the time of the output of H level data is indicated by I1h+I2h.

Moreover, each of signal transmission circuits 65-1a to 65-3a may be configured by a similar logic circuit (an NAND gate in FIG. 2) to achieve the same signal propagation time period in these signal transmission circuits. This results in the same signal propagation time period from internal node Nr to the respective nodes N1a to N3a at the output of the H level data, so that the operation timing of a plurality of P-channel transistors driving current may be set to be the same. Therefore, data signal Dout having the H level may be driven onto output node No at a desired timing, to attain stabilized operation.

Output buffer 50 has signal transmission circuits 67-1b to 67-3b provided respectively corresponding to N-channel transistors Q1b to Q3b. Each of signal transmission circuits 67-1b to 67-3b is constituted by an NAND gate and an inverter.

Signal transmission circuit 67-1b transmits the AND operation result of selection signal SL1b and data level control signal Drl to node N1b, i.e. the gate of N-channel transistor Q1b. Signal transmission circuit 67-2b transmits the AND operation result of selection signal SL2b and data level control signal Drl to node N2b, i.e. the gate of N-channel transistor Q2b. Signal transmission circuit 67-3b transmits the AND operation result of selection signal SL3b and data level control signal Drl to node N3b, i.e. the gate of N-channel transistor Q3b.

Such a configuration allows each of N-channel transistors Q1b to Q3b to form a current path corresponding to the size of each transistor between ground voltage Vss and output node No in response to the activation of data level control signal Drl to the H level, when a corresponding selection signal is set to be at the H level, i.e., to be in the activated state. In FIG. 2, the current drivability of N-channel transistors Q1b to Q3b are denoted by I1l to I3l, respectively. Current drivability I1l to I3l may be set in a manner similar to that of I1h to I3h.

Therefore, the current drivability for driving data signal Dout to the L level (ground voltage Vss) can be adjusted stepwise in accordance with presence/absence of the program input to operation selection circuits 60-1b to 60-3b.

For example, when the program input is provided to operation selection circuit 60-3b, only transistor Q3a is set to be in the activated state. Thus, the current drivability at the output of H level data is indicated by I3l.

Furthermore, each of signal transmission circuits 67-1b to 67-3b may be configured by similar logic circuits (an AND gate and an inverter in FIG. 2) to attain the same signal propagation time period in these signal transmission circuits. This results in a similar signal propagation time period with which the signal is propagated from internal node Nr to the respective nodes N1b to N3b at the output of L level data, so that a similar operation timing of the plurality of N-channel transistors driving current can be set. Therefore, data signal Dout having the L level may be driven to output node No at a desired timing, to attain stabilized operation.

Two transistors coupled in series between power-supply voltage Vcc and ground voltage Vss constitute one output buffer unit. For example, in the configuration of FIG. 2, transistors Q1a and Q1b constitute an output buffer unit 71, transistors Q2a and Q2b constitute an output buffer unit 72, and transistors Q3a and Q3b constitute an output buffer unit 73.

The signal propagation time period in each of signal transmission circuits 65-1a to 65-3a and that in each of signal transmission circuits 67-1b to 67-3b are set to have different values. This can prevent through current generated in the P-channel transistor and N-channel transistor constituting the same output buffer unit.

Figure 4:
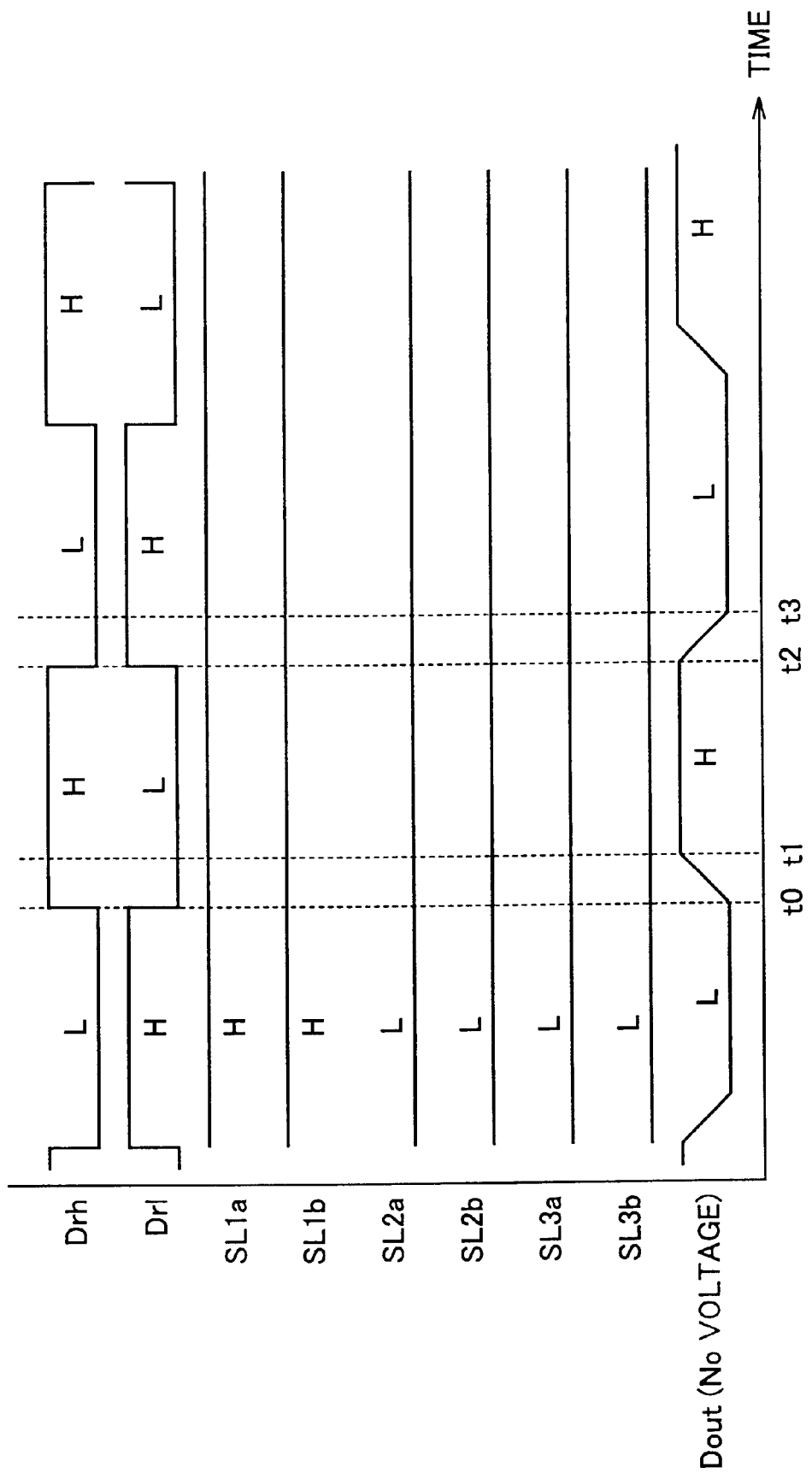
FIG. 4 is a timing chart illustrating the operation of the output buffer shown in FIG. 2.

Referring to FIG. 4, taking output load 12 into consideration, program inputs are provided to operation selection circuits 60-1a and 60-1b of the plurality of operation selection circuits shown in FIG. 2. In response to this, selection signals SL1a and SL1b are set to be at the H level in a non-volatile manner. Selection signals SL2a, SL2b, SL3a and SL3b corresponding to the other operation selection circuits are set to be at the L level in a non-volatile manner.

At time t0, data level control signals Drh and Drl are set to be at the H level and L level, respectively, in accordance with the change of output data Dr to the H level. In response to this, the level of node N1a in FIG. 2 is set to be at the L level, turning on transistor Q1a and hence allowing current I1h to flow between power-supply voltage Vcc and output node No. On the other hand, the other transistors Q2a, Q3a and Q1b to Q3b remain off.

Since current drivability I1h is a value appropriately pre-set in accordance with output load 12, the voltage of output node No, i.e. data signal Dout rises fully to the H level at time t1 at a speed satisfying the defined access time without any overshoot or undershoot that would be a cause of noise.

Subsequently, at time t2, data level control signals Drh and Drl are set to be at the L level and H level, respectively, in accordance with the change of output data Dr to the L level. In response to this, the level of node N1b in FIG. 2 is set to be at the H level, turning on transistor Q1b and allowing current I1l to flow between ground voltage Vss and output node No. On the other hand, the other transistors Q2b, Q3b and Q1a to Q3a remain off.

Since current drivability I1l is a value appropriately pre-set in accordance with output load 12, the voltage of output node No, i.e. data signal Dout falls fully to the L level at time t3 at a speed satisfying the defined access time without any overshoot or undershoot that would be a cause of noise.

Thus, in the latter steps of the manufacturing process of the semiconductor integrated circuit device, the current drivability of the output buffer can easily be adjusted by selectively applying program inputs, without any design change or mask revision involved. Therefore, fine adjustment is possible reflecting the effect of noise on the other circuits, variation at the time of manufacturing, and so forth. In addition, the generalized design can accommodate to a wide range of the output load, so that alleviation of the design load or reduction of inventory may also be achieved.

Modification of the First Embodiment

Figure 5:
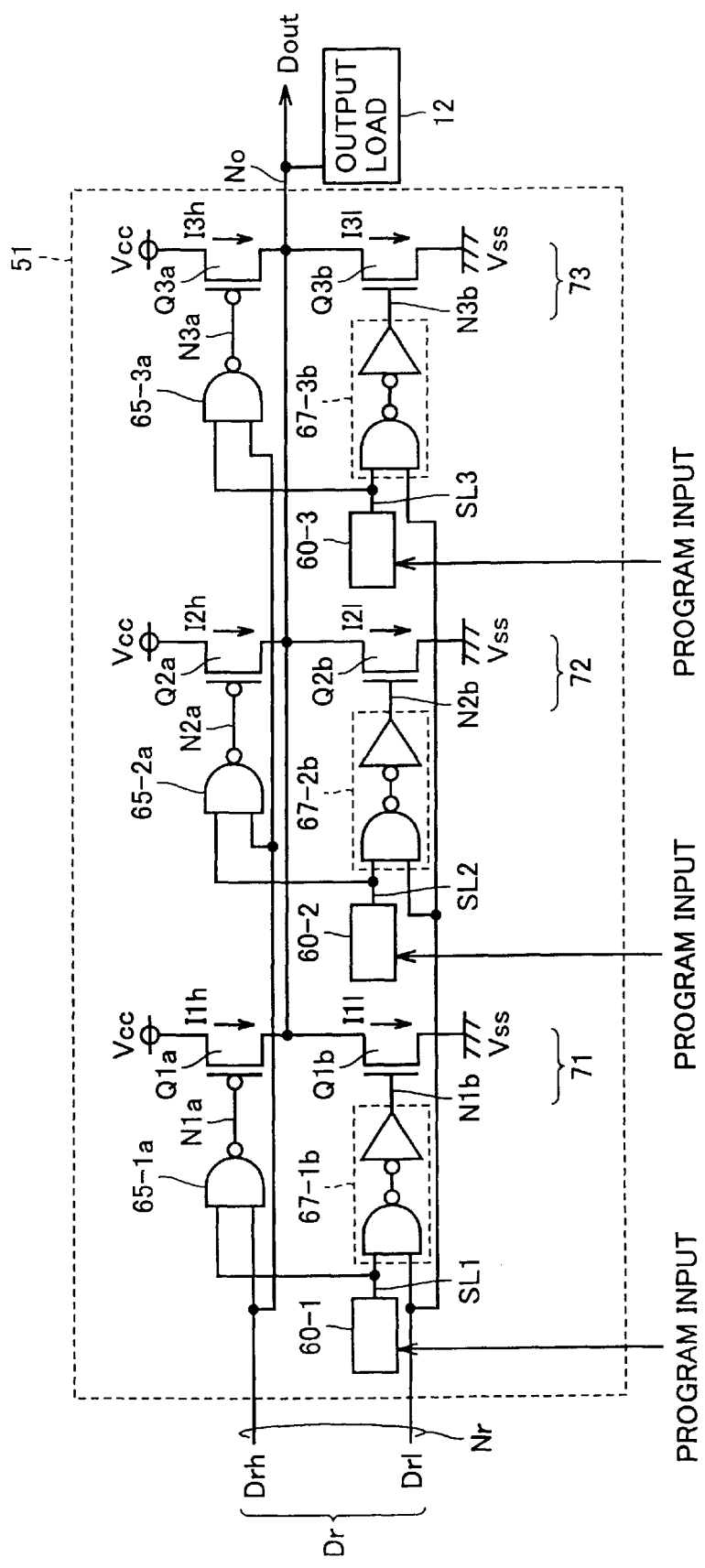
FIG. 5 is a circuit diagram showing the configuration of a modified example of the first embodiment.

Referring to FIG. 5, an output buffer 51 according to a modification of the first embodiment is different from output buffer 50 according to the first embodiment shown in FIG. 2 in that an operation selection circuit is arranged for each output buffer unit. That is, operation selection circuits 60-1, 60-2 and 60-3 are arranged respectively corresponding to output buffer units 71, 72 and 73. The configuration of the other portions is similar to that of output buffer 50 according to the first embodiment shown in FIG. 2, so that the description thereof will not be repeated.

Each of operation selection circuits 60-1 to 60-3 is shared by a current driving unit constituting a corresponding output buffer unit, i.e., is shared between transistors. For example, operation selection circuit 60-1 is shared by a P-channel transistor Q1a and N-channel transistor Q1b constituting output buffer unit 71. Therefore, signal transmission circuits 65-1a and 67-1b receive, to operate, selection signal SL1 output by operation selection circuit 60-1. The other output buffer units 71 and 72 are configured likewise.

Such a configuration can reduce the number of operation selection circuits, i.e. the number of program units, compared to the case in the first embodiment. However, setting of the amount of current may be executed only per output buffer unit, degrading the degree of freedom for the adjustment of the current drivability, compared to the configuration according to the first embodiment in which the current drivability may be selected independently to the respective H level data output and L level data output.

Second Embodiment

Figure 6:
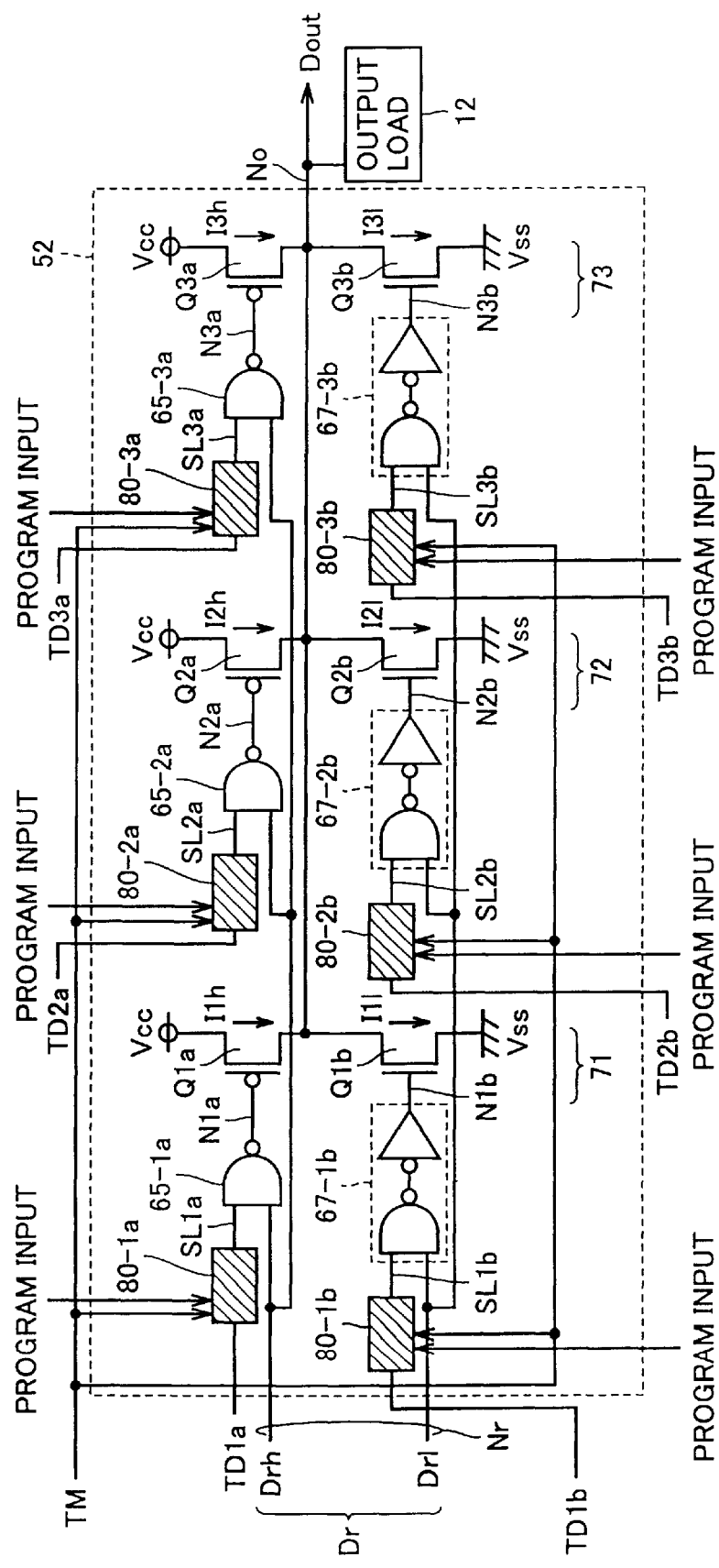
FIG. 6 is a circuit diagram showing the configuration of the output buffer according to the second embodiment.

Referring to FIG. 6, an output buffer 52 according to the second embodiment is different from output buffer 50 according to the first embodiment shown in FIG. 2, in that it includes operation selection circuits 80-1a to 80-3a and 80-1b to 80-3b in place of operation selection circuits 60-1a to 60-3a. The configuration of the other portions is similar to that of output buffer 50 according to the first embodiment shown in FIG. 2, so that the description thereof will not be repeated.

Figure 7:
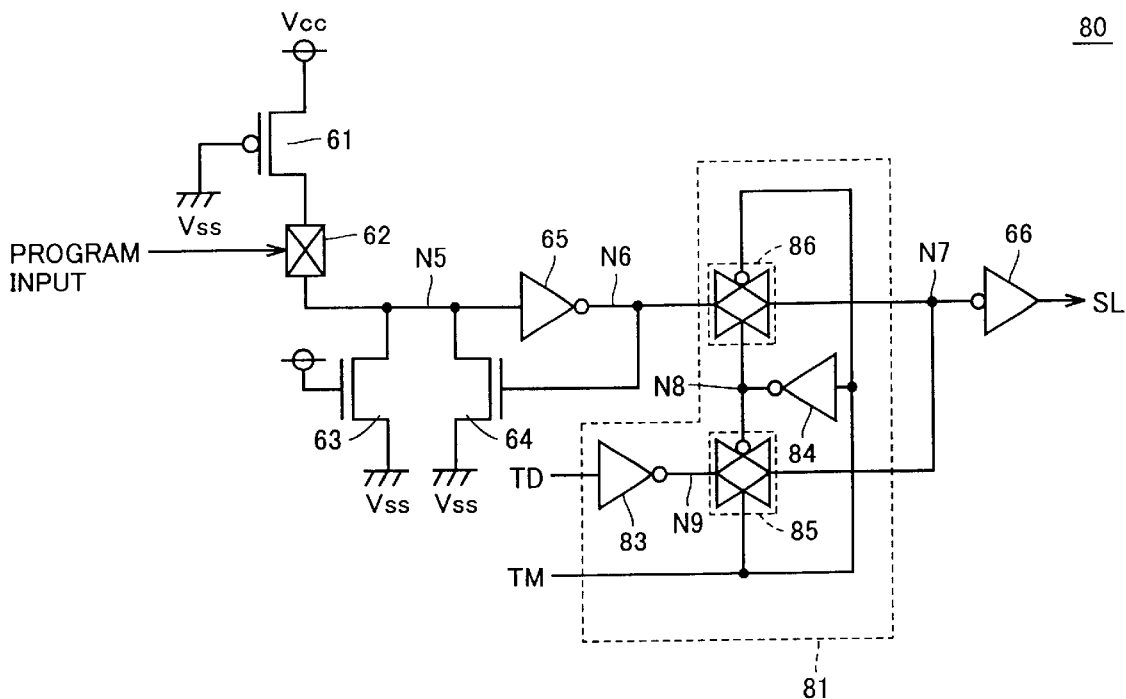
FIG. 7 is a circuit diagram showing the configuration of an operation selection circuit shown in FIG. 6.

Operation selection circuits shown in FIG. 6 have the same configuration, so that operation selection circuits 80-1a to 80-3a and 80-1b to 80-3b are collectively referred to as an operation selection circuit 80 in FIG. 7 in describing the configuration thereof.

Referring to FIG. 7, operation selection circuit 80 is different from operation selection circuit 90 shown in FIG. 3, in that it further includes a selection circuit for test (hereinafter referred to as test selection circuit 81) arranged between node N6 and node N7 in addition to the configuration of operation selection circuit 60 shown in FIG. 3 constituted by P-channel transistor 61, program unit 62, N-channel transistors 63, 64, and inverters 65, 66.

The output side of inverter 65 is coupled to N6, whereas the input side of inverter 66 is coupled to node N7.

Test selection circuit 81 has inverters 83, 84, and transfer gates 85, 86.

Inverter 83 inverts test data TD input during the test mode and outputs the inverted data to node N9. Inverter 84 inverts a test mode signal TM and outputs the inverted signal to node N8. Test mode signal TM is activated to be at the H level during the test mode, and is inactivated to be at the L level during a normal operation mode. Transfer gates 85 and 86 are complementarily turned on and off in accordance with the level of test mode signal TM.

The test data may be configured such that it is input directly from the outside during the test mode, or that pre-input data may be stored in a register or the like to be read out in the test mode.

Figure 8:
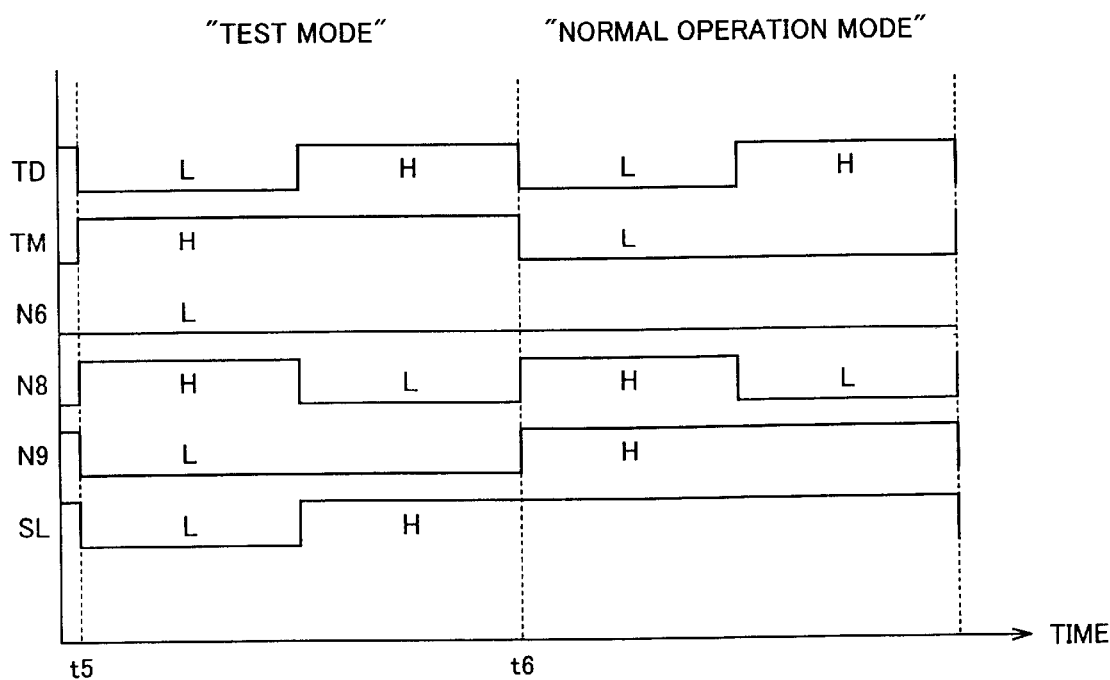
FIG. 8 is a timing chart illustrating the operation of the operation selection circuit shown in FIG. 7.

Referring to FIG. 8, no program input is applied to program unit 62, so that program unit 62 is conductive. Thus, the signal level of node N6 is set to be at the L level in a non-volatile manner.

At time t5, test mode signal TM is activated to be at the H level, and the test mode is initiated. During the test mode set between time t5 and t6, test data TD has a period for which the data is set at the L level and a period for which the data is set at the H level. The respective inversion signals of test data TD and test mode signal TM appear at nodes N8 and N9.

During the test mode, transfer gates 85 and 86 are respectively turned on and off in response to the setting of test mode signal TM to the H level. This allows the voltage of node N9, not of node N6, to be transmitted to the input side of inverter 66. Therefore, in the test mode, selection signal SL is set in accordance with the signal level of test data TD.

On the other hand, when, at time t6, test mode signal TM is inactivated to be at the H level and hence the mode is shifted from the test mode to the normal operation mode, transfer gate 86 is turned on whereas transfer gate 85 is turned off. Therefore, in the normal operation mode, selection signal SL is set to be at the H level in a non-volatile manner, in accordance with that the voltage of node N6, i.e. program unit 62, is in the conductive state.

Thus, in operation selection circuit 80, in the normal operation mode, the level of selection signal SL is set in accordance with the state (conductive or non-conductive) of program unit 62, as in the case with operation selection circuit 60 shown in FIG. 3. Whereas, in the test mode, the level of selection signal SL is set in accordance with test data TD.

Such a configuration allows program unit 62 to be set as conductive/non-conductive in a simulated manner in accordance with test data TD, in the test mode, without actual application of a program input to program unit 62 to set the conductive/non-conductive state in a non-volatile manner.

Therefore, in each of the operation selection circuits, the program unit may be set to be in the conductive/non-conductive state in a simulated manner to execute adjustment of the current drivability of the output buffer reversibly and with a high degree of freedom. Moreover, by applying a program input for setting an optimal current drivability corresponding to an output load, based on the result of the operation test, the current drivability of the output buffer can be adjusted reflecting the result of the operation test executed after completion of the wafer manufacturing process.

In addition, the operation selection circuit having a configuration according to the second embodiment may be arranged per output buffer unit as in the case with the modification of the first embodiment, to reduce the arrangement number of operation selection circuits.

Third Embodiment

A variation of the operation selection circuit is further described in the third embodiment.

Figure 9:
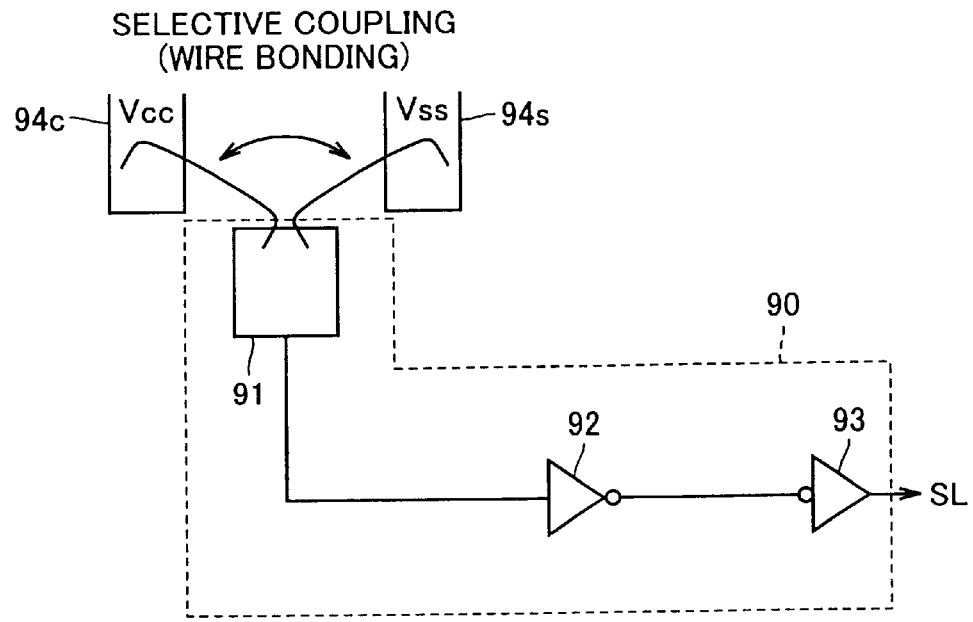
FIG. 9 is a circuit diagram showing the configuration of an operation selection circuit according to the third embodiment.

An operation selection circuit 90 according to the third embodiment shown in FIG. 9 may be used, as in the operation selection circuits shown in the second embodiment, in place of each of operation selection circuits 60-1a to 60-3a and 60-1b to 60-3b in output buffer 50 shown in FIG. 2.

Referring to FIG. 9, operation selection circuit 90 has a pad 91, and inverters 92 and 93. Pad 91 is electrically coupled selectively to either one of a voltage pad 94c supplying power-supply voltage Vcc and a voltage pad 94s supplying ground voltage Vss. The electrical coupling between pad 91 and voltage pad 94c or 94s can be realized by, for example, wire bonding executed in the step of assembling.

Inverter 92 inverts the voltage level transmitted to pad 91 and outputs the inverted result, and inverter 93 further inverts the output of inverter 92 and generates a selection signal SL. Operation selection circuit 90 sets the level of selection signal SL in accordance with the voltage of pad 91. Therefore, selective coupling of pad 91 and one of voltage pads 94c and 94s by the wire bonding can set the signal level of selection signal SL in a non-volatile manner.

Operation selection circuit 90 configured as described above may be applied into the output buffer illustrated in the first embodiment and the modification thereof, to attain a similar effect.

Modification of the Third Embodiment

Figure 10:
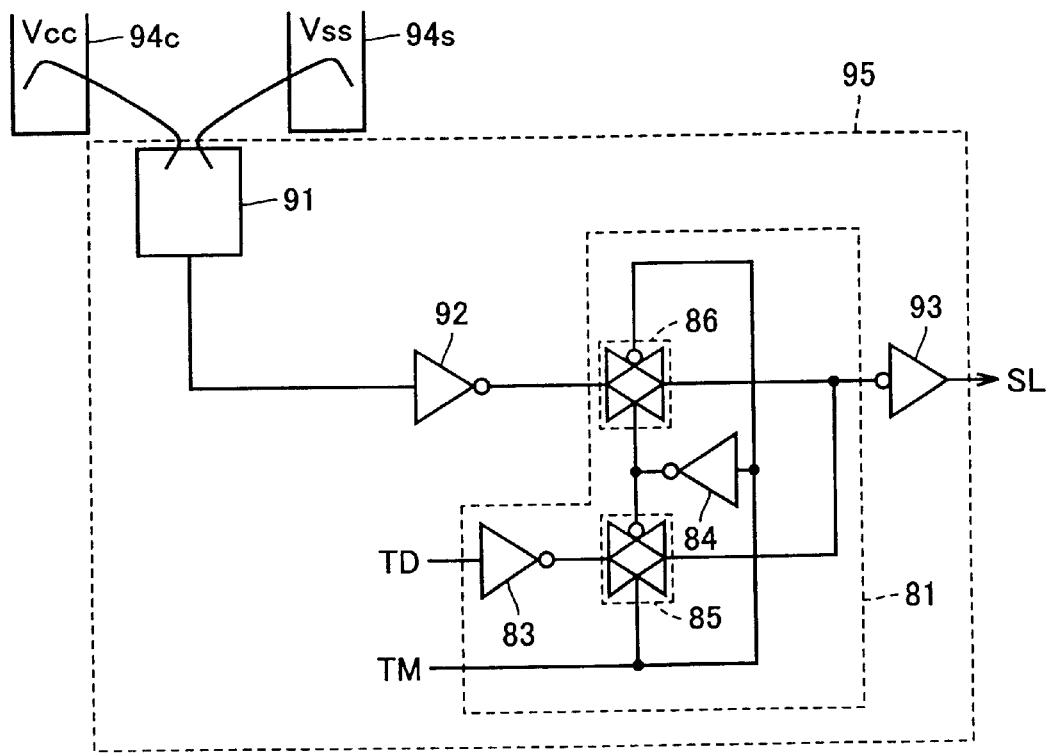
FIG. 10 is a circuit diagram showing the configuration of an operation selection circuit according to a modification of the third embodiment.

Referring to FIG. 10, operation selection circuit 95 according to a modification of the third embodiment is different from operation selection circuit 90 shown in FIG. 8 in that it further includes a test selection circuit 81 as shown in FIG. 6 arranged between inverters 92 and 93 in addition to operation selection circuit 90 shown in FIG. 8.

The configuration and operation of test selection circuit 81 are as described with reference to FIGS. 7 and 8, so that the description thereof will not be repeated.

Such a configuration allows operation selection circuit 95 to set the level of selection signal SL in accordance with the voltage of pad 91, in the normal operation mode, as in the case with operation selection circuit 90 shown in FIG. 9. On the other hand, in the test mode, the level of selection signal SL is set in accordance with test data TD. Therefore, during the test mode, the current drivability of the output buffer can be changed reversibly and with a high degree of freedom, not involving the wire bonding.

Therefore, operation selection circuit 95 according to the modification of the third embodiment may also be used in the output buffer according to the second embodiment, to attain a similar effect. Furthermore, the number of operation selection circuits can be reduced by arranging operation selection circuit 95 for each output buffer unit, as in the case with the modification of the first embodiment.

Fourth Embodiment

In the fourth embodiment, a configuration for efficiently setting an operation condition of a circuit in a semiconductor integrated circuit device constituted by an MCP.

Figure 11:
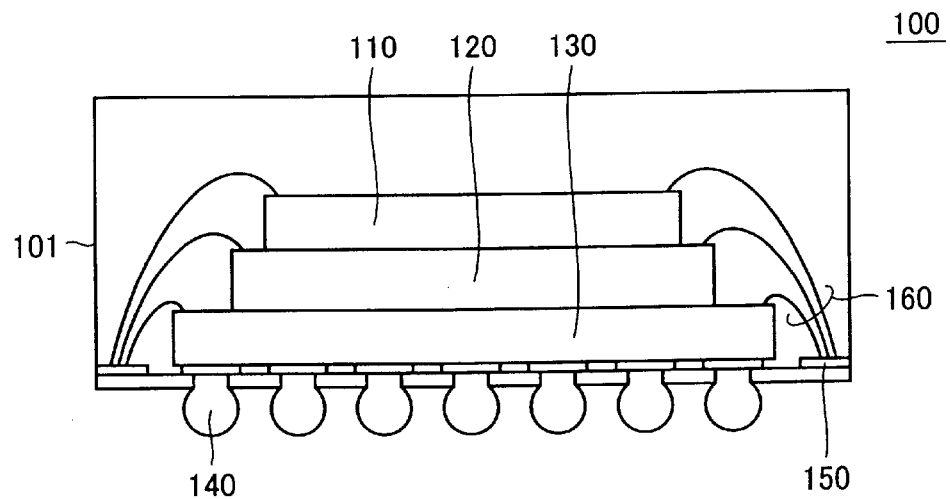
FIG. 11 is a schematic view showing the configuration of a semiconductor integrated circuit device according to the fourth embodiment.

Referring to FIG. 11, a semiconductor integrated circuit device 100 according to the fourth embodiment is constituted by a plurality of chips enclosed within the same package 101. In FIG. 11, an example is shown where semiconductor integrated circuit device 100 is constituted by laminated three chips 110, 120 and 130.

Semiconductor integrated circuit device 100 further includes an external terminal 140 for transmitting/receiving signals to/from the outside, and an inner lead 160 arranged as a coupling unit for electrically coupling external terminal 140 and each chip via a lead frame 150. Such a configuration enables transmission/reception of signals between each of chips 110, 120 and 130 and the outside via external terminal 140.

Signal transmission/reception is also enabled between each of chips 110, 120 and 130 via lead frame 150 and inner lead 160. Moreover, signal transmission/reception between the chips may also be executed using other members, provided within package 101, such as a wire frame capable of electrical signal transmission, or using direct coupling of the chips by a wire in the same package.

Figure 12:
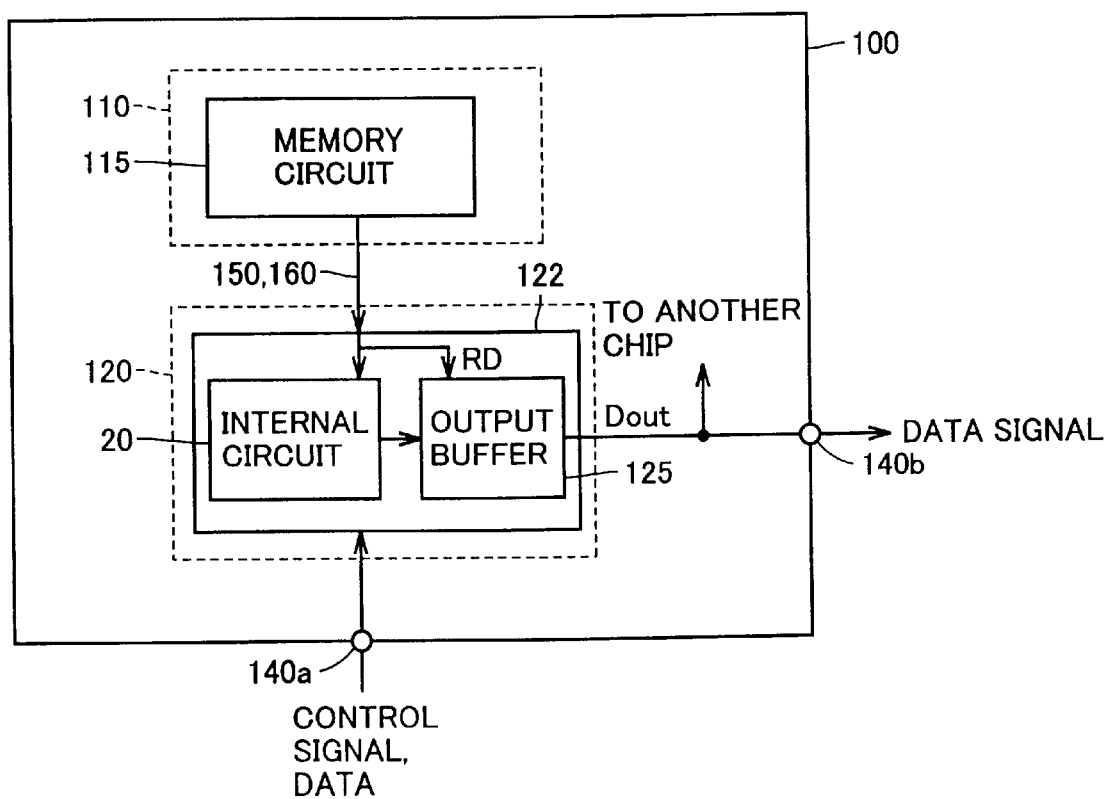
FIG. 12 is a schematic block diagram illustrating setting of an operation condition in the semiconductor integrated circuit device according to the fourth embodiment.

Referring to FIG. 12, semiconductor integrated circuit device 100 includes a memory circuit 115 mounted on chip 110, and an integrated circuit 122 mounted on chip 120. Integrated circuit 122 includes an internal circuit 20 and an output buffer 125. A control signal or data corresponding to the operation instruction from the outside is applied to integrated circuit 122 by an external terminal 140a. Integrated circuit 122 outputs the data output in response to the operation instruction, to another chip, or to the outside via an external terminal 140b.

Information for designating the operation condition of a circuit mounted on another chip is pre-stored in a partial region of memory circuit 115. For example, in the configuration shown in FIG. 12, memory circuit 115 stores information related to the operation condition of integrated circuit 122 mounted on chip 120. The information from memory circuit 115 is transmitted to integrated circuit 122 via the coupling unit constituted by lead frame 150 and inner lead 160. The information from memory circuit 115 includes read information RD for setting the current drivability in output buffer 125.

Figure 13:
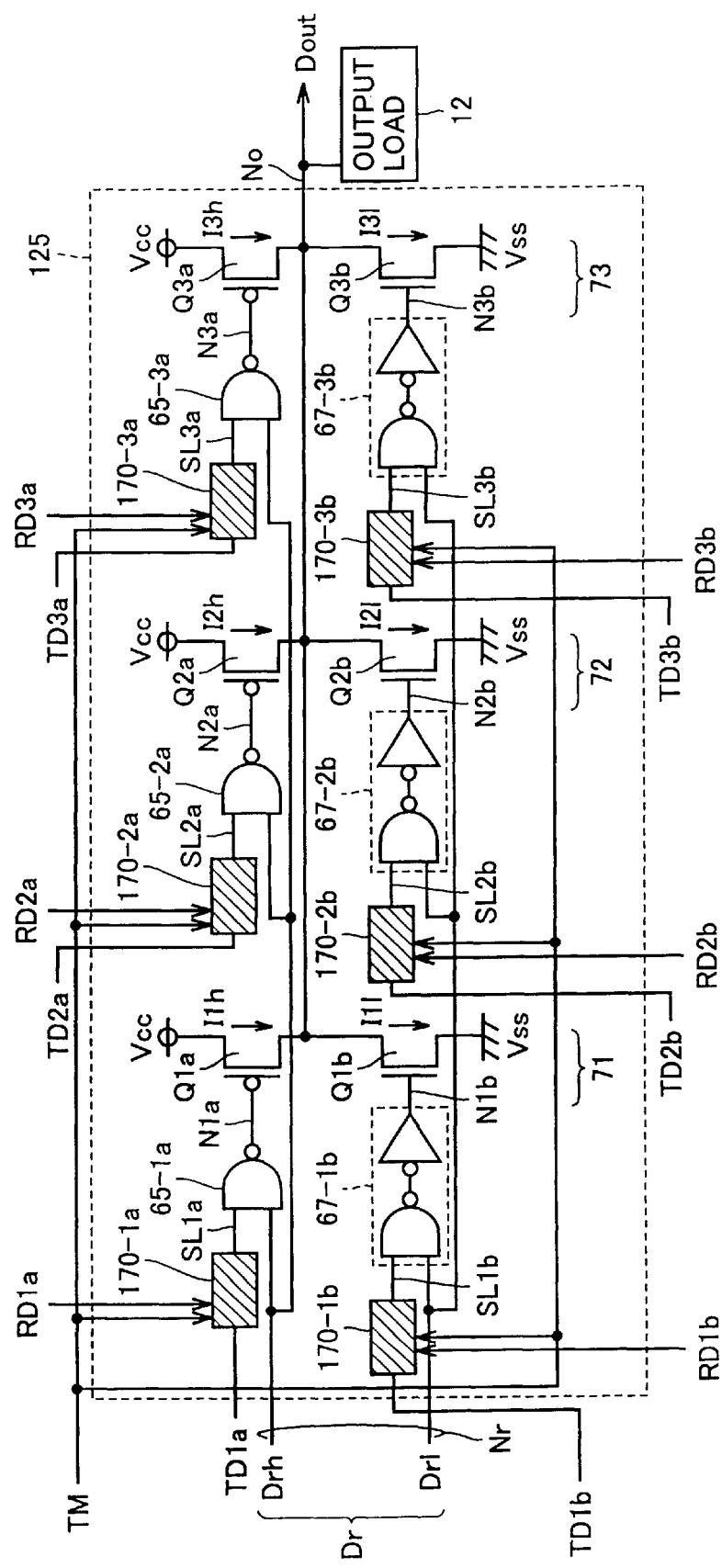
FIG. 13 is a circuit diagram showing the configuration of an output buffer shown in FIG. 12.

Referring to FIG. 13, output buffer 125 is different from output buffer 52 shown in FIG. 6 in that it includes operation selection circuits 170-1a to 170-3a and 170-1b to 170-3b in place of operation selection circuits 80-1a to 80-3a and 80-1b to 80-3b. The other configurations and operations are similar to those of output buffer 52, so that the description thereof will not be repeated.

Read information RD1a to RD3a and RD1b to RD3b from memory circuit 115 are applied to operation selection circuits 170-1a to 170-3a and 170-1b to 170-3b, respectively. It is noted that read information RD1a to RD3a and RD1b to RD3b may be collectively referred to as read information RD.

Figure 14:
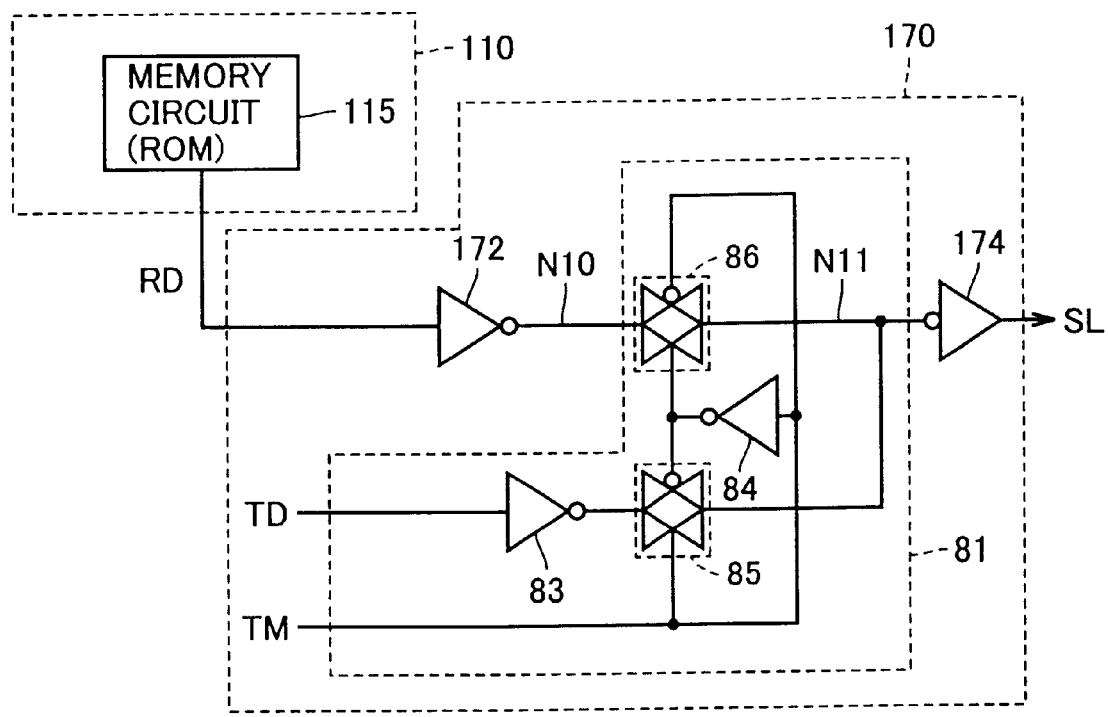
FIG. 14 is a circuit diagram showing the configuration of an operation selection circuit shown in FIG. 13.

Referring to FIG. 14, operation selection circuit 170 includes an inverter 172 inverting read information RD from memory circuit 115 mounted on chip 110 and outputting the inverted result to node N10; and an inverter 174 inverting the signal level of node N11 and outputting a selection signal SL. Memory circuit 115 is constituted by, for example, a ROM (Read Only Memory) executing non-volatile data storing.

Test selection circuit 81 is arranged between nodes N10 and N11 as in the case with FIG. 10. The configuration of test selection circuit 81 is as described with reference to FIG. 7, so that the description thereof will not be repeated.

Such a configuration allows selection signal SL to be set in accordance with the read information from memory circuit 115 mounted on another chip 110 in the normal operation mode. On the other hand, in the test mode, selection signal SL may be set in accordance with externally-input test data TD.

Thus, in the semiconductor integrated circuit device constituted by a plurality of chips, the current supplying power of output buffer 125 for driving the data signal output from integrated circuit 122 can efficiently be set. Therefore, adjustment of the operation condition of the output buffer is enabled without execution of program inputting operation, for example via the step of fuse blowing.

Figure 15:
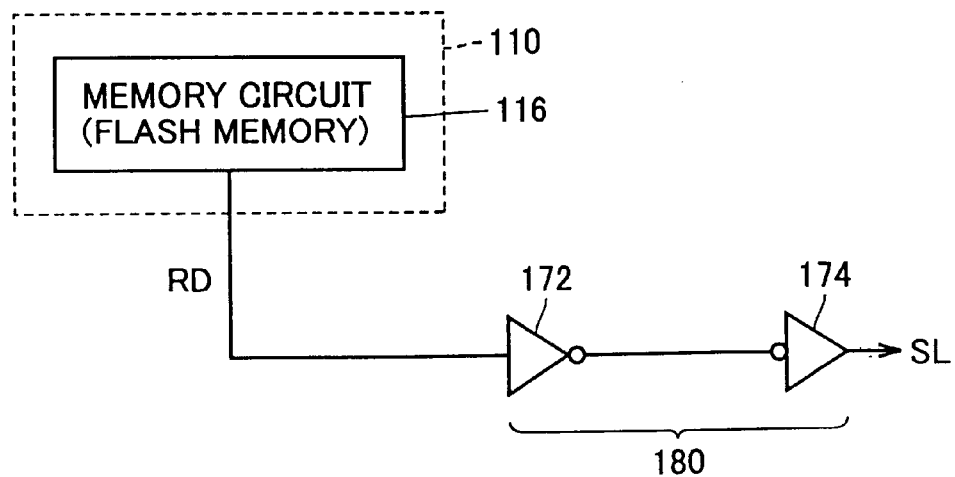
FIG. 15 is a circuit diagram showing another configuration example of the operation selection circuit.
Figure 16:
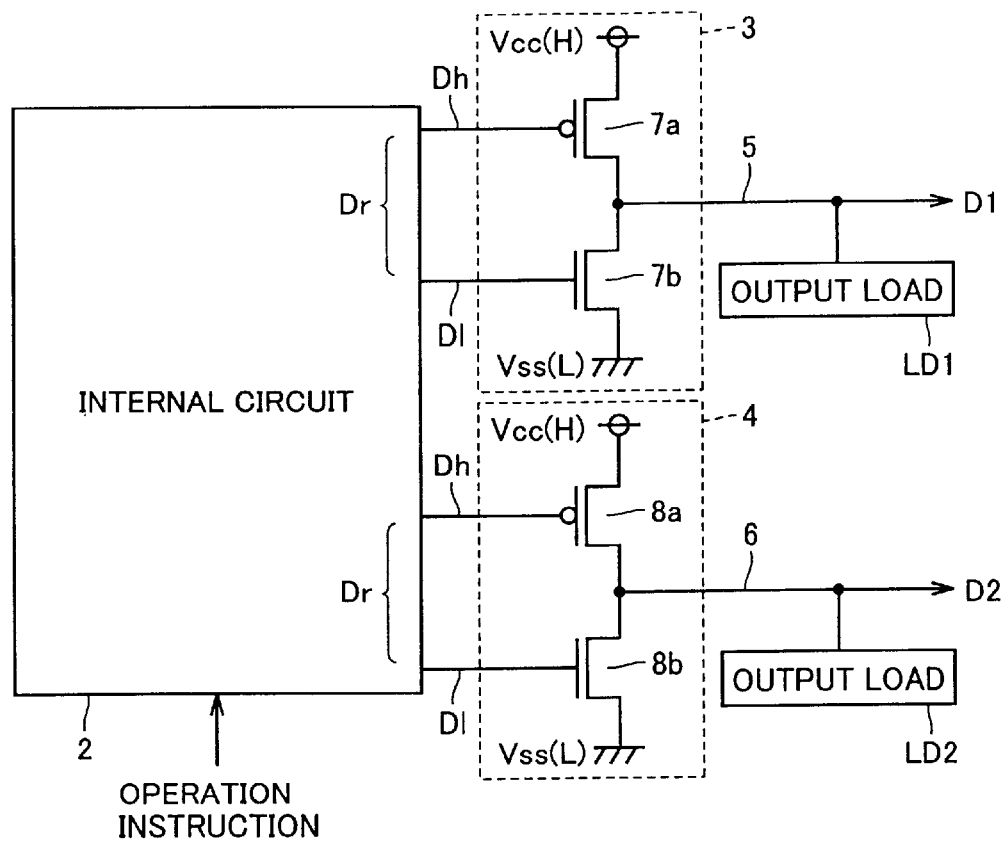
FIG. 16 is a schematic block diagram showing the configuration of a conventional semiconductor integrated circuit device including an output buffer.
Figure 17A:
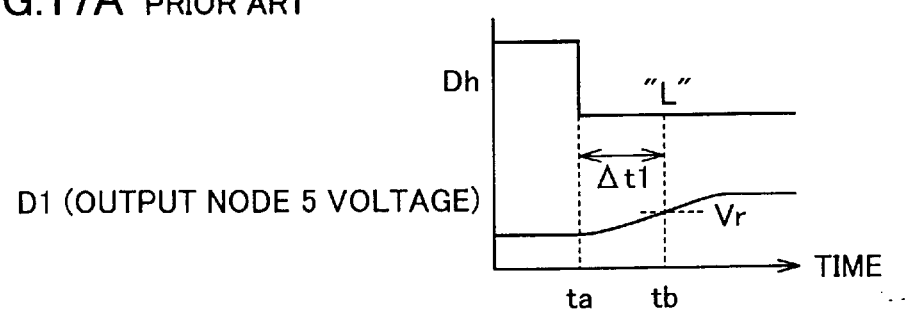
FIGS. 17A and 17B are schematic views each showing the relationship between a current drivability of the output buffer and a change in the voltage of a data signal.
Figure 17B:
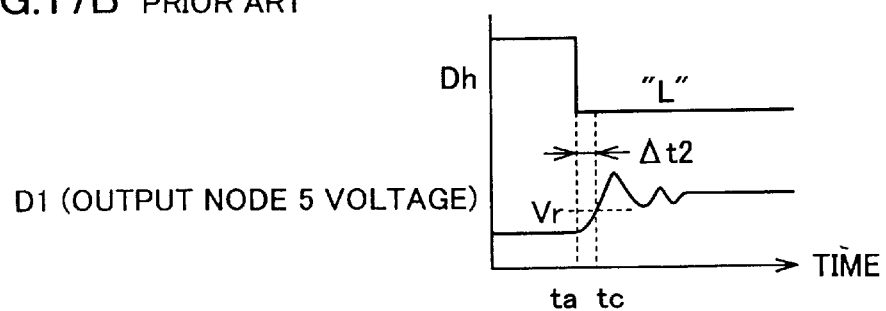

FIG. 15 is a circuit diagram of operation selection circuit 180 according to another configuration example.

Referring to FIG. 15, a memory circuit 116 of a non-volatile memory in which the stored data can be rewritten, e.g. a flash memory, is arranged in another chip 110. Operation selection circuit 180 has inverters 172 and 174 for generating a selection signal SL in accordance with read information RD from memory circuit 116.

Thus, by storing read information RD for setting the operation condition of the output buffer into the rewritable non-volatile memory such as a flash memory, a similar effect can be attained, eliminating the needs for the arrangement of test selection circuit 81 shown in FIG. 14. This can simplify the circuit configuration and can also reduce the cost.

It is noted that operation selection circuits shown in FIGS. 14 and 15 may be arranged per output buffer unit as in the modification of the first embodiment so as to reduce the number of operation selection circuits.

Although in the fourth embodiment, a configuration is shown where the operation condition of the output buffer in the circuit mounted on one chip is set in accordance with the information stored in the memory circuit mounted on another chip in the semiconductor integrated circuit device with a multi-chip package configuration including a plurality of chips, the application of the configuration as shown in the fourth embodiment is not limited to such a case. Therefore, a configuration is possible in which an arbitrary operation condition for an internal circuit mounted on one chip, not limited to the operation condition of the output buffer, may be set based on the read information from a memory circuit mounted on another chip enclosed in the same package.

Alternatively, a configuration is also possible in which the internal circuit and a memory circuit which stores the information related to the operation condition of the internal circuit are mounted on the same chip.

Furthermore, although an example of the circuit in which current driving units Q1a to Q3a in the output buffer are constituted by P-channel transistors were shown in the first to fourth embodiments, these units may also be constituted by N-channel transistors. In such a case, the circuit may be designed such that the configuration of signal transmission circuits 65-1a to 65-3a may appropriately be changed to form a current path in the transistor selected to be in the activated state, when output data Dr is set to be at the H level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device outputting data having a first and second levels, comprising:
    an internal circuit outputting said data; and
    an output buffer outputting said data read from said internal circuit onto an internal node to an output node, said output buffer including
        a plurality of first current driving units coupled in parallel with each other between a voltage corresponding to said first level and said output node,
        each of said first current driving units forming a current path between the voltage corresponding to said first level and said output node, in accordance with a voltage of a corresponding control node;
        a plurality of second current driving units coupled in parallel with each other between a voltage corresponding to said second level and said output node,
        each of said second current driving units forming a current path between the voltage corresponding to said second level and said output node, in accordance with a voltage of a corresponding control node;
        a plurality of operation selection units provided respectively corresponding to said plurality of first and second current driving units, and each setting a corresponding one of said plurality of first and second current driving units to one of an activated state and an inactivated state in a nonvolatile manner, at least after completion of a wafer manufacturing process;
        a plurality of first signal transmission units provided respectively corresponding to said plurality of first current driving units, and each transmitting a level of said data from said internal node to a control node of a corresponding first current driving unit with a first propagation time period, when the corresponding first current driving unit is in said activated state; and
        a plurality of second signal transmission units provided respectively corresponding to said plurality of second current driving units, and each transmitting a level of said data from said internal node to a control node of a corresponding second current driving unit, when the corresponding second current driving unit is in said activated state.

2. The semiconductor integrated circuit device according to claim 1, wherein
    said plurality of first and second current driving units are each arranged in a same number,
    one of said plurality of first current driving units and one of said second current driving units constitute an output buffer unit, and
    respective two of said plurality of operation selection units corresponding to a same said output buffer unit is provided sharing a same circuit.

3. The semiconductor integrated circuit device according to claim 1, wherein
    each of said first signal transmission units sets, when the corresponding first current driving unit is set to be in said inactivated state by a corresponding operation selection circuit, a voltage of a corresponding control node so as to cut off said current path in the corresponding first current driving unit, and
    each of said second signal transmission units sets, when the corresponding second current driving unit is set to be in said inactivated state by a corresponding operation selection circuit, a voltage of a corresponding control node so as to cut off said current path in the corresponding second current driving unit.

4. The semiconductor integrated circuit device according to claim 1, wherein
    each of said operation selection circuits includes a program unit shifting from a first state to a second state in a non-volatile manner in accordance with an external program input,
    each of said operation selection circuits generates a selection signal to set the corresponding one of said plurality of first and second current driving units to be in one of said activated state and said inactivated state in accordance with the state of said program unit,
    each of said first signal transmission units includes a first logic circuit setting a voltage of the control node of said corresponding first current driving unit in accordance with said selection signal from a corresponding one of said plurality of operation selection circuits and a level of said data read from said internal circuit, and
    each of said second signal transmission units includes a second logic circuit setting a voltage of the control node of said corresponding second current driving unit in accordance with said selection signal from a corresponding one of said plurality of operation selection circuits and a level of said data read from said internal circuit.

5. The semiconductor integrated circuit device according to claim 4, wherein
    each of said operation selection circuits further includes a test selection circuit to set a level of said selection signal based on externally-input test data, in a test mode, irrespective of a state of said program unit.

6. The semiconductor integrated circuit device according to claim 1, wherein each of said operation selection circuits includes a pad electrically coupled to one of a plurality of voltages, each of said operation selection circuits generates a selection signal to set the corresponding one of said plurality of first and second current driving units to be in one of said activated state and said inactivated state, in accordance with a voltage of said pad, each of said first signal transmission units includes a first logic circuit setting a voltage of the control node of said corresponding first current driving unit in accordance with said selection signal from a corresponding one of said plurality of operation selection circuits and a level of said data read from said internal circuit, and each of said second signal transmission units includes a second logic circuit setting a voltage of the control node of said corresponding second current driving unit in accordance with said selection signal from a corresponding one of said plurality of operation selection circuits and a level of said data read from said internal circuit.

7. The semiconductor integrated circuit device according to claim 6, wherein said one of said plurality of voltages and said pad are coupled by wire bonding.

8. The semiconductor integrated circuit device according to claim 6, wherein each of said operation selection circuits further includes a test selection circuit setting a level of said selection signal based on externally-input test data, in a test mode, irrespective of the voltage of said pad.

9. The semiconductor integrated circuit device according to claim 1, further comprising:

a memory circuit at least capable of reading of stored data;

each of said operation selection circuits generating a selection signal to set the corresponding one of said first and second current driving units to be in one of said activated state and said inactivated state, in accordance with the read data from said memory circuit, each of said first signal transmission units including a first logic circuit setting a voltage of the control node of said corresponding first current driving unit in accordance with a level of said selection signal from a corresponding one of said plurality of operation selection circuits and a level of said data read from said internal circuit, each of said second signal transmission units including a second logic circuit setting a voltage of the control node of said corresponding second current driving unit in accordance with said selection signal from a corresponding one of said plurality of operation selection circuits and a level of said data read from said internal circuit.

10. The semiconductor integrated circuit device according to claim 9, wherein each of said operation selection circuits further includes a test selection circuit to set a level of said selection signal based on externally-input test data, in a test mode, irrespective of said stored data read from said memory circuit.

11. The semiconductor integrated circuit device according to claim 9, wherein said stored data is rewritable in said memory circuit.

12. The semiconductor integrated circuit device according to claim 1, wherein the voltage corresponding to said first level is common to each of said first current driving units, and the voltage corresponding to said second level is common to each of said second current driving units.

13. The semiconductor integrated circuit device according to claim 1, wherein at least one of the voltage corresponding to said first level and the voltage corresponding to said second level is constituted by at least two kinds of voltages.

14. A semiconductor integrated circuit device including a plurality of chips enclosed within a same package, comprising:

an internal circuit formed on one of said plurality of chips;

a memory circuit formed on another one of said plurality of chips and at least capable of reading stored data; and a coupling unit electrically coupling said internal circuit with said memory circuit, said internal circuit operating in accordance with an operation condition set based on the stored data read from said memory circuit.

15. The semiconductor integrated circuit device according to claim 14, further comprising:

an output buffer formed on the same chip as said internal circuit and outputting said data to an output node;

said internal circuit outputting data having first and second levels, said output buffer forming a current path between said output node and one of a voltage corresponding to said first level and a voltage corresponding to said second level in accordance with a level of said data, said operation condition setting an amount of current in said current path.

16. The semiconductor integrated circuit device according to claim 15, wherein said output buffer includes a plurality of first current driving units coupled in parallel with each other between the voltage corresponding to said first level and said output node, and each forming the current path between the voltage corresponding to said first level and said output node, when said read data is at said first level in an activated state, a plurality of second current driving units coupled in parallel with each other between the voltage corresponding to said second level and said output node, and each forming the current path between the voltage corresponding to said second level and said output node, when said read data is at said second level in said activated state, and a plurality of operation selection units provided respectively corresponding to said plurality of first and second current driving units, and each setting a corresponding one of said plurality of first and second current driving units to one of said activated state and inactivated state, based on the stored data read from said second memory unit.

17. The semiconductor integrated circuit device according to claim 14, wherein said memory circuit is a non-volatile memory capable of rewriting of said stored data.

* * * * *